_United States Patent_ [19]

Cazaux

[11] Patent Number: 5,073,908
[45] Date of Patent: Dec. 17, 1991

[54] READING REGISTERS OF THE CHARGE-COUPLED DEVICE TYPE WITH WIDE RANGE OF OUTPUT

[75] Inventor: Yvon Cazaux, Grenoble, France

[73] Assignee: Thomson Composants Militaires et Spatiaux, Courbevoie, France

[21] Appl. No.: 492,753

[22] Filed: Mar. 13, 1990

[30] Foreign Application Priority Data

Mar. 28, 1989 [FR] France ................ 89 03986

[51] Int. Cl.[5] ................ G11C 19/28; H01L 29/78
[52] U.S. Cl. ................ 377/62; 377/58; 377/60; 357/24
[58] Field of Search ................ 377/57–63; 357/24, 24 M; 307/607; 358/213.23, 213.24, 213.26, 213.31; 365/183

[56] References Cited

U.S. PATENT DOCUMENTS

| 4,280,067 | 7/1981 | Kohyama | 377/62 |
| 4,554,675 | 11/1985 | Miwada | 377/60 |
| 4,603,426 | 7/1986 | Sauer | 377/60 |
| 4,627,083 | 2/1986 | Pelgrom et al. | 377/60 |
| 4,811,371 | 3/1989 | Tower | 377/60 |
| 4,873,562 | 10/1989 | Cazaux et al. | 377/61 |
| 4,878,103 | 10/1989 | Cazaux et al. | 377/61 |

FOREIGN PATENT DOCUMENTS

0192142 8/1986 European Pat. Off. .

Primary Examiner—Stanley D. Miller
Assistant Examiner—Tai V. Duong
Attorney, Agent, or Firm—Oblon, Spivak, McClelland, Maier & Neustadt

[57] ABSTRACT

Disclosed is a reading register of the type formed, firstly, by a shift register of the charge-coupled device type working according to a mode other than a two-phase mode and, secondly, an output circuit. It is notably an object of the invention improve the dynamic range, in amplitude, of the output signal delivered by the output circuit for supply voltages. The reading register has a substrate, bearing a shift register and an output circuit, separated from each other by an output gate. The shift register includes a sequence of transfer stages, each having at least three electrodes receiving transfer pulses of different phases, this sequence of stages being separated from the output gate by a last transfer stage or output transfer stage having at least three successive electrodes. According to one characteristic of the invention, the last two electrodes of the transfer stage are connected to each other and receive one and the same voltage pulse. The invention can be applied to reading registers for memory devices, photosensitive devices for cameras, etc.

4 Claims, 4 Drawing Sheets

READING REGISTERS OF THE CHARGE-COUPLED DEVICE TYPE WITH WIDE RANGE OF OUTPUT

BACKGROUND OF THE INVENTION

1. Field of the Invention

The invention applies to reading registers formed by means of a shift register of the charge-coupled device type and having an output stage mounted at least partially on one and the same semiconductor substrate as the shift register. The invention can be applied particularly in the case of shift registers working in a mode that is not two-phased, and it particularly concerns means designed to obtain a greater range in amplitude of the output signal for given supply voltages.

2. Description of the Prior Art

Reading registers of this type are commonly used in memory devices or delay lines or, again, for example in photosensitive sensors for cameras.

Charge-coupled devices are semiconductor-using systems wherein charges are stored in potential wells and wherein these charges are conveyed from one point to another by being transferred from one potential well to a neighboring potential well: the charges thus successively occupy all the potential wells between the zone of departure and the zone of arrival of these charges. In fact, the charges flow substantially on the surface of the semiconductor substrate or, possibly, in a shallow layer located near the surface (in a so-called "buried channel" device).

Figure 1:
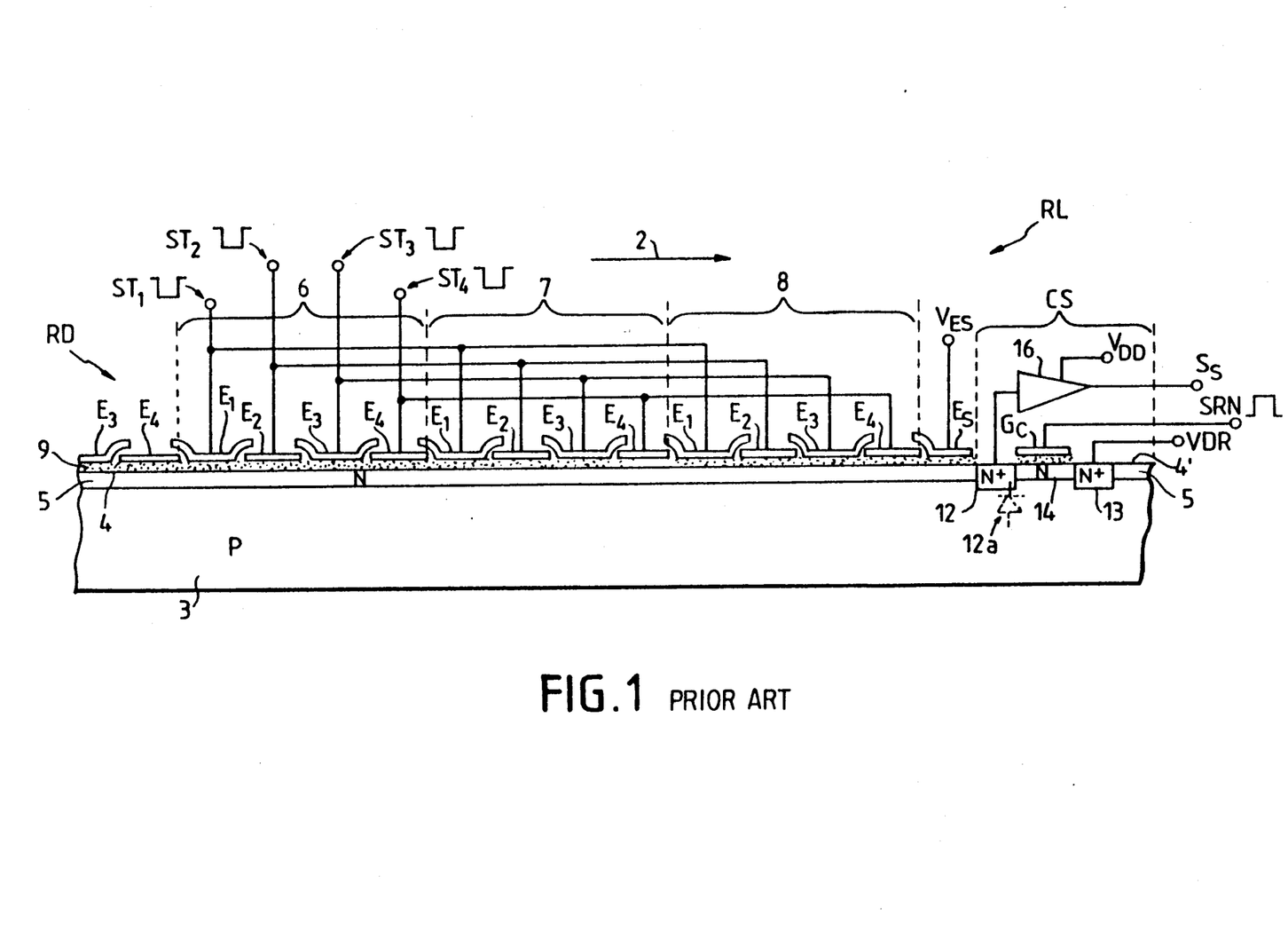
FIG. 1, already described, gives a partial description of a prior art reading register.

FIG. 1 gives a schematic and partial view of known type of reading register such as the one described above. This reading register is represented by a view in a section parallel to the direction in which the charges are transferred. This direction is symbolized in the figure by an arrow 2. The reading register is formed on a substrate 3 within, for example, P type doping. Near its surface 4, this substrate 3 may have a layer 5 with N type doping, in order to form a buried channel in a standard way. The reading register is formed by an shift register RD followed, in the direction of transfer of the charges, by an output circuit CS. The shift register includes a plurality of successive transfer stages, each having at least three electrodes. For the greater clarity of FIG. 1, a sequence of only three transfer stages, 6, 7, 8, has been shown, the last transfer stage 8 being in the vicinity of the output circuit CS, from which it is separated by an output electrode ES.

In the example shown by FIG. 1, the shift register RD is of the type working in four-phase mode in a standard way, that is, the transfer stages 6, 7, 8 each have, in the direction of transfer of the charges, a sequence of four electrodes E1, E2, E3, E4 made on top of the substrate 3. More precisely, these electrodes, as well as the output electrode ES, are made on top of an electrically insulating layer 9 which separates them from the N doped layer 5. The four electrodes E1 to E4 of each transfer stage are controlled by cyclical voltage pulses or transfer signals ST1, ST2, ST3, ST4 with different phases so as to generate, beneath these electrodes, potential barriers and potential wells to transfer the charges to the output circuit CS. The first, second, third and fourth transfer signals ST1, ST2, ST3, ST4 are applied respectively to all the first, second, third, fourth electrodes E1, E2, E3, E4.

The fourth electrode E4 of the transfer stage closest to the output circuit CS, namely the last transfer stage 8, forms the last electrode (according to the charge transfer direction 2) of the shift register RD, and it is followed by the output electrode ES to which a potential VES, a DC potential for example, is applied, making it possible to set up, in the output electrode ES, a potential barrier of separation between the potentials created beneath the last transfer stage 8 and an element for the terminal storage of the charges belonging to the output circuit CS. This element for the terminal storage of the charges is represented in the figure by zone 12 with N+type doping, that is, doping of the same type as that of the buried channel 5 but with more doping than this channel. This N+zone is inserted into the buried channel 5.

In fact, the junction between this N+doped zone 12 and the substrate 3, which has the opposite type of conductivity, i.e. it is P doped, sets up a diode 12a (symbolized in the figure by dashes) called a reading diode. When this diode 12a is reverse biased, it has a capacitance which provides for the storage of the charges in a standard way, and the reading diode 12a thus forms the above-mentioned terminal storage element.

Still in the charge transfer direction 2, we then find, above the substrate 3, a control gate GC which is itself followed by a second zone 13 with N+type doping, namely a zone of the same type as the buried channel 5, but with heavier doping than the latter: this second N+zone 13 is also inserted in the buried channel 5. In fact, the first N+doped zone 12, followed by a part 14 of the buried channel above which the control gate GC is placed, and the second N+doped zone 13 form a MOS type transistor, the zone 12 of which represents, for example, the source, the zone 13 of which represents the drain and the electrode GC of which represents the control gate. A DC supply voltage VDR of, for example +12 volts with respect to the potential of the substrate 3, is applied to the second zone 13 or drain and, furthermore, a resetting pulse SRN is applied to the control gate GC in order to make the MOS transistor conductive and, consequently, carry the first zone 12 to the potential of VDR. It does this at well-determined instants, outside which the potential of the first zone 12 (and hence the reading diode 12a) is floating and may therefore vary as a function of the accumulated charges. The reading diode 12a is connected to the input of an output amplifier 16 which receives a supply voltage $V_{DD}$ and delivers an output signal Ss, the value of which is a function of the quantity of charges present at the reading diode 12a.

FIGS. 2a to 2f illustrate the differences in phases among the transfer pulses or signals ST1 to ST4, and the relationship between these signals and the output signal Ss delivered by the output amplifier 16.

The transfer signals ST1 to ST4 are shown respectively in FIGS. 2a to 2d. These figures have one and the same shape, one and the same frequency but a different phase, and may have a state 0 or a state 1, the state 1 representing a positive potential with respect to the state 0. FIG. 2e represents the resetting pulses SRN which are applied to the control gate GC: these pulses vary also between a state 0 and a state 1 (which is positive with respect to the state 0). FIG. 2f illustrates the variations in amplitude of voltage VS of the output signal Ss which may vary, for example, between a maximum positive value +VSM corresponding to the value of the potential of VDR and a maximum negative value —VSM corresponding to a maximum quantity of charges on the reading diode 12a.

At the instant t0: the first transfer signal ST1, which is applied to the first electrodes E1, goes from the state 0 to the state 1. The second transfer signal ST2, applied to the second electrodes E2, is at the state 0. The third transfer signal ST3, applied to the third electrodes E3, is at the state 1. The fourth transfer signal ST4, applied to the fourth electrodes E4 is at the state 1; the resetting pulse SRN applied to the control electrode GC ends and goe from the state 1 to the state 0; the output signal Ss is at the value of +VSM, the reading diode having been connected to the potential VDR for the duration of the resetting pulse SRN It should be noted that hereinafter only the states of the signals which have not been modified with respect to the above-mentioned instants are specified.

At the instant t1: the third transfer signal ST3 goes from the state 1 to the state 0. The output signal Ss has gone to a value Vst which is smaller than the value VSM and which represents a value of stabilization after the resetting operation. The reading diode, from this instant t1 onwards, is in principle ready to receive charges which will be expressed by a modification of the output signal Ss at output of the output amplifier 16. Assuming that, subsequently, no charge is transferred to the reading diode 12a, the output signal Sa preserves its stabilization value VST until the instant when a new resetting signal SRN starts.

At the instant t2: the second transfer signal ST2 goes from the state 0 to the state 1.

At the instant t3: the fourth transfer signal ST4 goes from the state 1 to the state 0.

At the instant t4: the third transfer signal ST3 goes from the state 0 to the state 1.

At the instant t5: the first transfer signal ST1 goes from the state 1 to the state 0.

At the instant t6: the fourth transfer signal ST4 goes from the state 0 to the state 1; a new resetting pulse starts; this pulse goes from the state 0 to the state 1; the output signal S tends from the value VST towards the value VSM.

At the instant t7 : the second transfer signal ST2 goes from the state 1 to the state 0; and the output signal Ss is at an intermediate level between the stabilization value VST and the maximum value VSM.

At the instant t8 : the first transfer signal STI goes from the state 0 to the state 1, and it is observed that the time between the instant t0 and the instant t8 corresponds to a full cycle of the first transfer signal ST1 and that this time corresponds to a time Tt for the transfer of charges from one stage to a following stage; the resetting signal Rn is completed and goes from the state 1 to the state 0. At this instant t8, the output signal Ss has recovered the value +VSM, following the resetting command, and tends towards the stabilization value VST.

At the instant t9: the third transfer signal ST3 goes from the state 1 to the state 0. It must be noted that this leads to the transferring, beneath the electrode E4, of the charges that were stored beneath the electrode E3. As a result, if the quantity of charges that were simultaneously contained beneath the electrode E3 and the electrode E4 were to be great, this transfer would have the consequence (as shall be further explained with reference to FIG. 3) of provoking an stray transfer of a part of these charges towards the reading diode 12a, the result of which is a negative variation of the output signal Ss which goes to a value VS1 below the stabilization value VST.

This brings out one of the major drawbacks of this operation in four-phase mode which, besides, has the advantage of providing for an efficient transfer of the charges owing to the presence, at the state ; (positive potential) of at least two neighboring electrodes. The drawback that has just been referred to lies in the fact that the operation just described leads to a disymmetry in the durations, firstly, of the time allocated to the resetting of the reading diode and, secondly, of the time allocated to the arrival of the charges at the reading diode. This drawback is particularly troublesome when the reading of the signal (corresponding to the charges transferred to the reading diode) is done by a method of double sampling or differential reading. For, in this case, the value of the useful signal at the output amplifier is given by the difference between the value read when all the charges have been transferred to the reading diode and the value present before the transfer of these charges, that is, theoretically, when the output signal Ss still has the value of the stabilization potential VST, which has a very short duration in this case.

At the instant t10: the second transfer signal ST2 goes from the state 0 to the state 1.

At the instant t11: the output signal Ss has the value VS1. The fourth transfer signal ST4, applied to all the fourth electrodes E4, goes from the state 1 to the state 0, namely to a more negative potential than that of the state 1. Assuming that the charges have been stored beneath the fourth electrode E4 of the first transfer stage, these charges are transferred to the reading diode 12a. This leads to a negative variation of the output signal Ss which goes from the value VS1 to the value VS2 which is lower than VS1 and is close, for example, to the maximum negative value —VSM, and the difference between these two values represents the quantity of charges transferred to the reading diode 12a from the instant t11 onwards.

At the instant t12: the output signal Ss has reached the value VS2; the third transfer signal ST3 goes from the state 0 to the state 1.

At the instant t13, the first transfer signal ST1 goes from the state 1 to the state 0 (as earlier at the instant t5).

At the instant t14: the same signals are found again as at the instant t6: the fourth transfer signal ST4 applied to the fourth electrodes E4 goes from the state 0 to the state 1. The start of the resetting pulse SRN is found, that is, the potential applied to the control electrode GC goes from the state 0 to the state 1. A positive variation is noted in the output signal Ss which, starting from the value VS2, tends towards the value VS which is reached at the instant t15.

At the instant t16: the same events are found as at the instants t0 to t8 and a same subsequent operation is got as the one just described.

Figure 3:
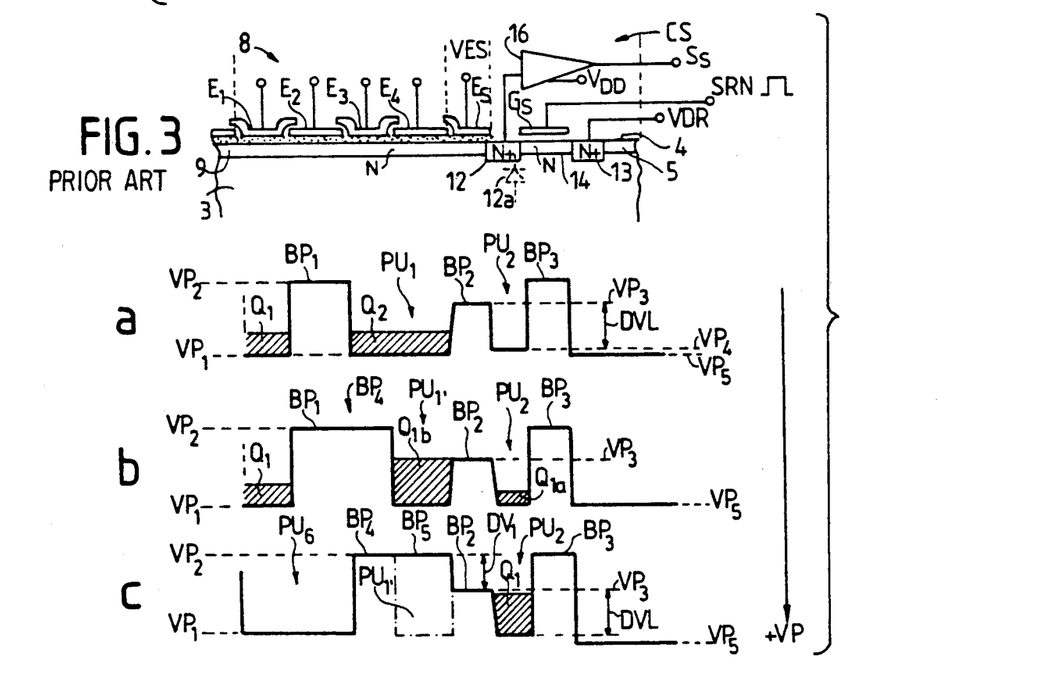

FIG. 3 shows the reading register RL in a sectional view similar to that of FIG. 2 but, in this figure, to simplify the description, the depiction of the shift register RD is restricted to the last transfer state 8, namely to the transfer stage closest to the output circuit CS. FIGS. 3a, 3b, 3c should be read with the FIG. 3, and illustrate the shapes of potentials VP set up beneath the different electrodes or gates and at the reading diode 12a. In accordance with the usual practice with respect to charge-coupled devices, the potentials are shown in increasing order downwards.

FIG. 3a shows the potentials VP set up in the substrate between the instant t8 and the instant t9. During this interval of time, the third and fourth transfer pulses ST3, ST4 are in the state 1 (the more positive potential) so that, beneath the third and fourth electrodes E3, E4, there is created a single potential well PU1, the depth of which corresponds to a potential VP1. At this instant, the second transfer pulse ST2 is at the state 0, the result of which, beneath the second electrode E2, is a potential VP2 that is negative with respect to the potential VP1 which is set u beneath the third and fourth electrodes E3, E4 and which forms a potential barrier BP1 beneath the second electrode E2. Also during this interval of time, the first transfer pulse ST1 is at the state 1 so that, beneath the first electrode E1, there is a potential VP1 with the same value as beneath the third and fourth electrodes E3, E4, and so that charges Q1, Q2 (shown by hatched lines in the figure) may be stored beneath these electrodes, in being separated by the potential barrier BP1. Thus, the potential well PU1 is formed between the potential barrier BP1, formed beneath the second electrode E2, and a second potential barrier BP2 formed beneath the output gate GS by the application of the potential VGS to this output gate; the value of the potential VGS is such that it generates, beneath the electrode GS, a potential VP3 which is between the potentials VP1 and VP2 and forms the potential barrier BP2.

Again between the instants t8 and t9, at the reading diode 12a with floating potential, namely beneath the N+type doped zone 12, the potential has a value VP4 close to a value VP5 generated beneath the second N+doped zone 13 by the application of the supply voltage VDR. Between these two N+doped zones 12, 13, the control gate GC receives the state 0 (negative potential) of the resetting pulse SRN, this resetting pulse being completed at the instant t8: the result thereof is that the potential beneath the control electrode GC is more negative than beneath the zones 12, 13 and has, for example, a value VP2 so as to form, beneath this control gate, a third potential barrier BP3 that separate the region carried to the potential VP5 (region located beneath the second zone 13) from the potential well PU2 which is formed beneath the first zone 12 and symbolizes the reading diode 12a.

The potential VP4 beneath the first zone 12, namely at the reading diode 12a, is substantially the one applied to the input of the amplifier 16 when no charge has been transferred to the reading diode 12a. This potential VP4 corresponds substantially to the value VST of the output signal, and constitutes the bottom of the potential well PU2 into which the charges get shed; this shedding of the charges modifies the potential applied to the input of the output amplifier 16 and determines the variations in amplitude of the output signal Ss delivered by this amplifier.

Between the potential VP4 of the bottom of the potential well PU2 and the potential VP3 of the second barrier BP2, there is formed a difference in potential DVL which represents the maximum dynamic range available at the reading diode and, consequently, corresponds to the maximum quantity of charges that can be stored in the potential well PU2. Thus, this difference in reading potential DVL should make it possible to collect the maximum charge that can be conveyed by the shift register RD so a not to restrict the dynamic range of the shift register.

FIG. 3b illustrates the shapes of potentials that are generated beneath the electrodes of the structure shown in FIG. 3, between the instants t9 and t10. At the instant t9, the third transfer signal ST3 goes to the state 0, the result of which is that: a fourth potential barrier BP4 is formed beneath the third electrode E3; this fourth potential barrier BP4 extends the first potential barrier BP1, with the effect, firstly, of converting the potential well PU1, shown in FIG. 3a, into a potential well PU1' with a smaller area, formed solely beneath the fourth electrode E4, in such a way that the quantity of charges Q1, which was stored earlier in the potential well PU1 formed beneath the two electrodes E3, E4, should be recovered in the potential well PU1' formed solely beneath the fourth electrode E4.

Under these conditions, when the quantity of charges Q1 is great enough, it may exceed the storage capacity of the potential well PU1', this storage capacity being limited by the height of the second potential barrier BP2, namely by the value of the potential VP3. In this case, where the quantity of charges Q1 is great, a part Q1a spills over the second potential barrier BP2 (formed beneath the output gate Gs) and thus reaches the reading diode. A remaining part Q1b remains stored in the potential well QU1' formed beneath the fourth electrode E4. This transfer, to the reading diode, of the part Q1a of the charges, generates the previously mentioned variation of the output signal Ss which goes from the value VSt to the value VS1; this variation has been cited as being liable to form a major drawback in the case of a reading by differential method.

Figure 2:
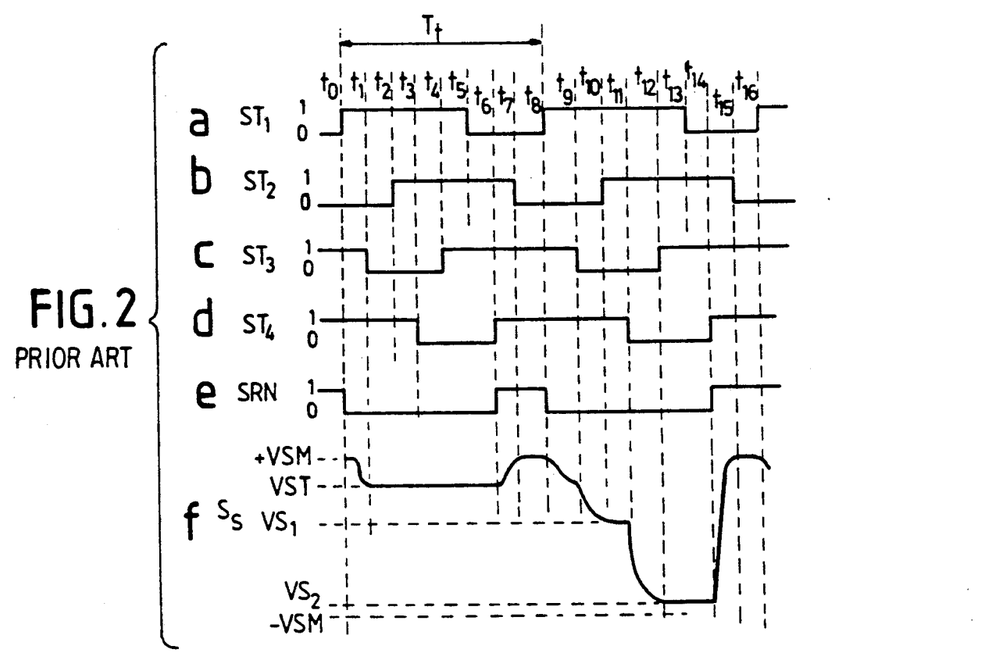
FIGS. 2a to 2e, already described, represent the signals applied to electrodes shown in FIG. 1.
FIG. 2f represents the output signals of an output amplifier shown in FIG. 1.

FIG. 3c illustrates the shapes of the potentials for the structure of FIG. 3, between the instant t10 and the instant t11, shown in FIGS. 2.

At the instant t10, the fourth transfer signal ST4 applied to the fourth electrode E4, goes from the state 1 to the state 0, the result of which is that, beneath the fourth electrode E4, the potential well PU1'(shown in dashes) is replaced by a fifth potential barrier BP5, adjacent to the fourth barrier BP4, in such a way that the quantity of charges QU1b, previously stored beneath the fourth electrode E4 (PU1') is transferred to the reading diode, namely into the potential well PU2. The top of the fifth potential barrier BP5 is formed, for example, by the potential VP2 which also forms the potential barriers BP1, BP3, BP4.

It must be noted that, between the top of the second potential barrier BP2 (that is, of the potential VP3) and the top of the fifth potential barrier BP5 (that is, of the potential VP2) there should be a difference in potential DV1 which is great enough for the charges that were stored beneath the fourth electrode E4 to be transferred to the reading diode before the fifth potential barrier BP5 (beneath the electrode E4) reaches the value VP2. For, if the difference DV1 is too small, some of the charges that were contained beneath the fourth electrode E4 may return backwards, namely towards a potential well PU6 formed beneath the second electrode E2 instead of being transferred to the reading diode, and this leads to a deterioration in the transfer efficiency of the register RD.

In the prior art, the difference in potential DV1 is obtained by significantly increasing the potential VES applied to the output electrode ES (by making this potential even more positive). But this may have the consequence of reducing the reading dynamic range and, in order to preserve a sufficient reading dynamic range, namely a sufficient difference in reading potential DVL, it is then necessary to resort to a disadvantageous solution which consists in increasing (to make it more positive) the voltage VDR which is used to do the resetting of the reading diode. The drawback resulting therefrom is that there is an increase in all the voltages useful for the operation of the output stage: the voltage VES applied to the output electrode, the voltage VDR applied to the second N+doped zone 13 and the voltage VDD for the supply of the output amplifier 16.

SUMMARY OF THE INVENTION

The present invention can be applied to a reading register of a type similar to the one described above, and an object of the present invention, notably, is to increase the output reading dynamic range without having the above-mentioned drawbacks. It is also an object of the invention to enable outpu readings by means of differential methods without vitiating these methods by an error due to an unwanted transfer of the charges to the reading diode, namely a transfer in two stages.

According to the invention, there is proposed a reading register comprising a semiconductor substrate, a charge-coupled device type of shift register formed by a sequence of transfer stages, an output circuit placed in the vicinity of the last transfer stage according to the direction of transfer of the charges, each transfer stage having at least three mutually independent electrodes to which there are applied pulses of cyclical voltages forming transfer pulses having different phases for each electrode oi one and the same transfer stage, so as to generate, in the substrate, potential wells and potential barriers used to transfer the charges towards the output circuit, the output circuit having a terminal element for the storage of charges forming, in the substrate, a zone with floating potential connected to a reading amplifier, the terminal element for the storage of charges being separated from the last transfer stage by an output gate beneath which there is formed a separation potential barrier, wherein, in the last transfer stage, two successive electrodes which are closest to the separation gate are connected to each other and receive one and the same output transfer pulse.

BRIEF DESCRIPTION OF THE DRAWINGS

The invention will be better understood from the following description, given by way of an example, and from the six appended figures, of which:

FIGS. 3 and 3a to 3f, already described, illustrate the working of the structure shown in FIG. 1;

FIGS. 6 and 6a to 6c illustrate shapes of potentials generated in the substrate of the structure of the invention shown in FIG. 4.

DETAILED DESCRIPTION OF THE INVENTION

Figure 4:
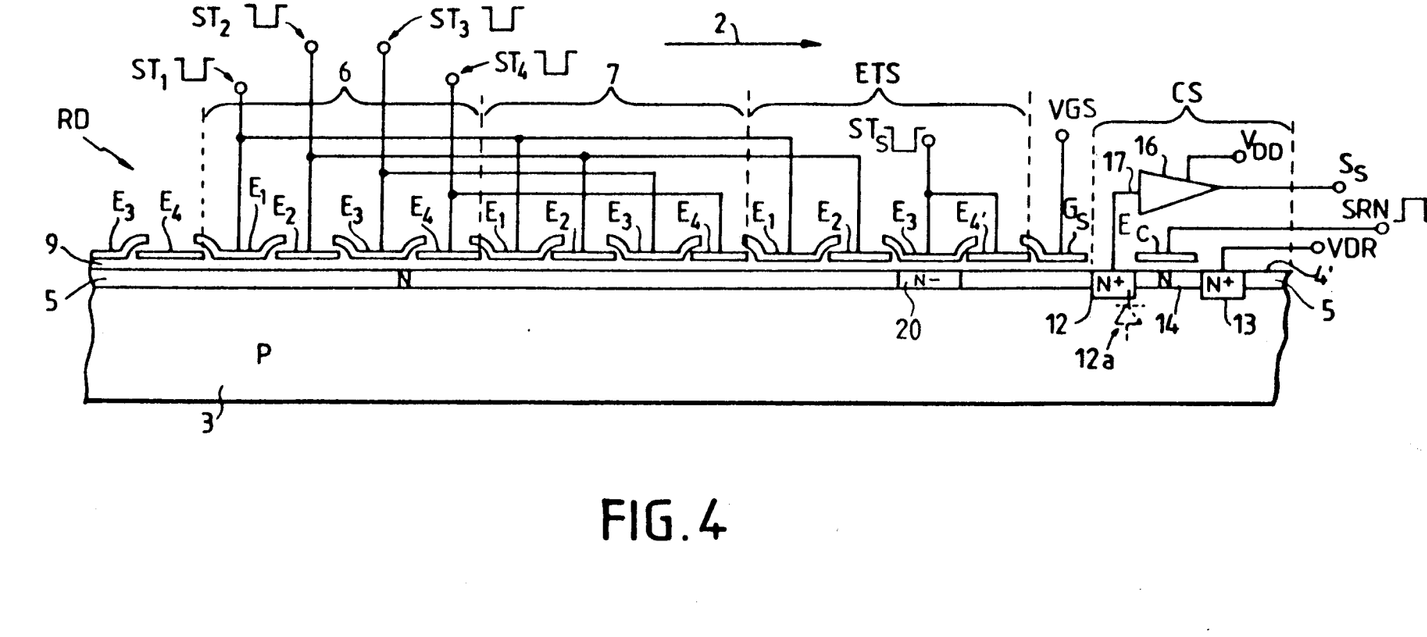
FIG. 4 is a sectional view similar to that of FIG. 1, and gives a partial view of a reading register according to the invention.

FIG. 4 gives a schematic view of a reading register RL according to the invention.

The reading register RL has a shift register RD which, for greater clarity of the description, is of the type working in four-phase mode, that is, with four electrodes per transfer stage a in the case of FIG. 1, in such a way that the differences that appear between the reading register of FIG. 1 and the reading register RL according to the invention, shown in FIG. 4, relate solely to the invention.

As in the prior art, the reading register RL has a substrate 3, with P type doping for example, with an N type doped layer 5 designed to form a buried channel. Above the buried channel 5, there is deposited an electrically insulating layer 9 on which there are deposited electrodes forming a shift register RD of the charge-coupled device type. The shift register RD is used to transfer the charges in the direction of transfer represented by the arrow 2 towards the output circuit CS.

As in the prior art, the output circuit CS has:
an output amplifier 16 which is supplied with a supply voltage $V_{DD}$ and delivers an output signal Ss;
a first N+doped zone 12 with a view to forming an element for the terminal storage of charges, that is, in the example, with a view to forming a reading diode 12a;
a second N+doped zone 13 which is connected to the resetting voltage VDR and is separated from the first zone 12 by a part 14 of the buried channel 5;
a control electrode EC located above the part 18, which is itself positioned between the first and second zones 12, 13, this control electrode EC receiving a resetting control signal SRN;
as in the prior art, the first N+doped zone 12 is connected to the input 17 of the output amplifier 16.

Again as in the prior art, the output circuit CS is separated from the shift register or, more precisely, from the transfer stage to which it is closely, by an output electrode or gate GS to which there is applied a potential VGS designed to form, beneath this output gate, a separating potential barrier.

According to one characteristic of the invention, among the transfer stages that form the shift register RD, the transfer stage which is closest to the output gate GS, namely the last transfer stage or output transfer stage ETS, has two successive electrodes E3', E4', connected to each other so as to receive the same cyclical voltage pulses, called output transfer signals STS, in order to be controlled simultaneously in the same direction, this being the case irrespectively of the number of electrodes in this output transfer stage ETS; these two electrodes E3', E4', connected to each other, are the two electrodes closest to the output gate GS, namely the two last electrodes in the charge transfer direction 2. Thus, in observing the structure of FIG. 4, starting from the output circuit CS, in a direction contrary to the direction of transfer of the charges, there are successively: the output gate GS, then the electrodes that belong to the output stage ETS, that is, firstly, the last or fourth electrode E4', and then the second last or third electrode E3'; these two electrodes being connected together; then there is the second electrode E2, followed by the first electrode E1 which also belongs to the output stage ETS; then, as in the prior art, there is a sequence of standard transfer stages 7, 6, only two of which have been shown, in order to simplify the figure, with four electrodes E4, E3, E2, E1 per transfer stage 6, 7; all the electrodes of one and the same row are connected to one another so as to receive transfer pulses ST1 to ST4 having one and the same phase as has been explained previously, i.e. all the electrodes E1 are connected to one another and receive the first transfer signal ST1, the second electrodes E2 are all connected to one another and receive the second transfer signal ST2 etc.

In the non-restrictive example of the invention, where the transfer stages 6, 7 have four electrodes each, the output transfer stage ETS of the invention is also made on the basis of a structure with four electrodes, but it could have more electrodes or only three of them. In the non-restrictive example described, the first and second electrodes E1, E2 of the output transfer stage are respectively connected to the other electrodes E1 and E2.

In this configuration, the third and fourth electrodes E3', E4' of the output transfer stage ETS are actuated simultaneously and, according to another characteristic of the invention, the third electrode E3' has a voltage compensation arrangement, provided by a dose of boron for example (in a manner that is standard per se), that is, beneath this electrode E3', the buried layer 5 includes an N− doped zone 20, i.e. a zone with the same type of conductivity as the buried zone 5 but with less doping than this buried zone. Thus, the electrode E3', which forms the first of the two mutually connected electrodes (in the charge transfer direction) forms the equivalent of a transfer electrode in two-phase mode, so that the potentials generated beneath these two electrodes E3', E4' have different levels that enable the transfer of charges towards the output circuit CS and counter this transfer in the opposite direction.

FIGS. 5a to 5f show a non-restrictive exemplary view of the signals to be applied to the reading register RL according to the invention, and FIG. 5g illustrates the variations that result therefrom in the output signal Ss.

FIG. 5a represents the transfer signals ST1 applied to all the first electrodes E1. FIG. 5b shows the second transfer signals ST2 applied to all the electrodes E2. FIG. 5c shows the third transfer signals ST3 applied to all the third electrodes E3. FIG. 5d shows the fourth transfer signals ST4 applied to all the electrodes E4. FIG. 5e shows the output transfer signals STS applied simultaneously to the electrodes E3' and E4' belonging to the output transfer stage ETS. FIG. 5f represents the resetting signals SRN applied to the control electrode EC. FIG. 5g represents the variations of the output signal Ss at the output of the output amplifier 16.

At the instant t0: the first transfer pulse ST1 goes from the state 0 to the state 1 (more positive potential); the output transfer signal STS goes from the state 1 to the state 0 (more negative potential); the output signal Ss is at the stabilization value VST.

At the instant t1: the third transfer signal ST3 goes from the state 1 to the state 0.

At the instant t2: the second transfer signal ST2 goes from the state 0 to the state 1.

At the instant t3: the fourth transfer signal goes from the state 1 to the state 0.

At the instant t4: the third transfer signal ST3 goes to the state 1. The output transfer signal STS goes from the state 0 to the state 1; the resetting signal SRN goes from the state 0 to the state 1 in order to command the resetting of the output signal Ss. The output signal S is then still at the stabilization value VST (in assuming that no charge has been transferred) and it tends, from the instant t4 onwards, towards the maximum positive value +VSM which corresponds to the application of the supply voltage VDR.

At the instant t5: the first transfer pulse ST1 goes from the state 1 to the state 0. The output signal Ss has reached the maximum positive value +VSM.

A the instant t6: the fourth transfer pulse ST4 goes from the state 0 to the state 1; the resetting pulse SRN goes from the state 1 to the state 0; the output signal Ss tends towards the stabilization value VST.

At the instant T7: the second transfer pulse ST2 goes from the state 1 to the state 0; the output signal Ss recovers the stabilization value.

At the instant T8: the first transfer pulse ST1 goes from the state 0 to the state 1. The output transfer signal STS goes from the state 1 to the state 0. This may cause a transfer of charges to the reading diode 12a and subsequently generate a negative variation of the output signal Ss.

At the instant T9: the third transfer signal ST3 goes from the state 1 to the state 0. Assuming that there has been a transfer of charges to the reading diode from the instant t8 onwards, the output signal Ss is, at the instant t9, at a value VS3 between the stabilization value VST and a maximum negative value −VSM which the output signal Ss may have when a maximum quantity of charges is transferred to the reading diode 12a.

At the instant t10: the second transfer signal ST2 goes from the state 0 to the state 1.

At the instant t11: the fourth transfer pulse ST4 goes from the state 1 to the state 0; and in assuming that the maximum of charges has been transferred to reading diode 12a, the output signal Ss is at a value close to the value −VSM.

At the instant t12: the third transfer signal ST3 goes from the state 0 to the state 1. The output transfer signal STS goes from the state 0 to the state 1, and this marks the end of the transfer, to the reading diode, of the charges that were contained beneath the (mutually connected) third and fourth electrodes E3', E4' of the output transfer stage. The resetting signal SRN goes from the state 0 to the state 1 so as to command the resetting of the reading diode; the output signal is at the maximum negative value −VSM and, from the instant t12 onwards, it tends towards the maximum positive value +VSM (owing to the resetting command which starts from the instant t12 onwards).

This operation is repeated cyclically and in a manner similar to the one that has just been described.

It must be noted that the output transfer signal STS, applied to the two mutually connected electrodes E3', E4', has a cyclical ratio that is substantially equal to one, thus enabling a symmetry of the periods of time allocated to the stage for resetting the reading diode and the stage of arrival of the charges at this diode. It may be further observed that, owing to the fact that the two electrodes E3' and E4' are controlled simultaneously and in the same direction, the arrival of the charges at the reading diode is obtained in a single operation, thus making it possible, notably, to increase the time during which the output signal Ss is at the stabilization value VST, between the instant t7 and the instant t8 for example: this permits a reading by a differential method in a simple and precise way.

Figure 6:
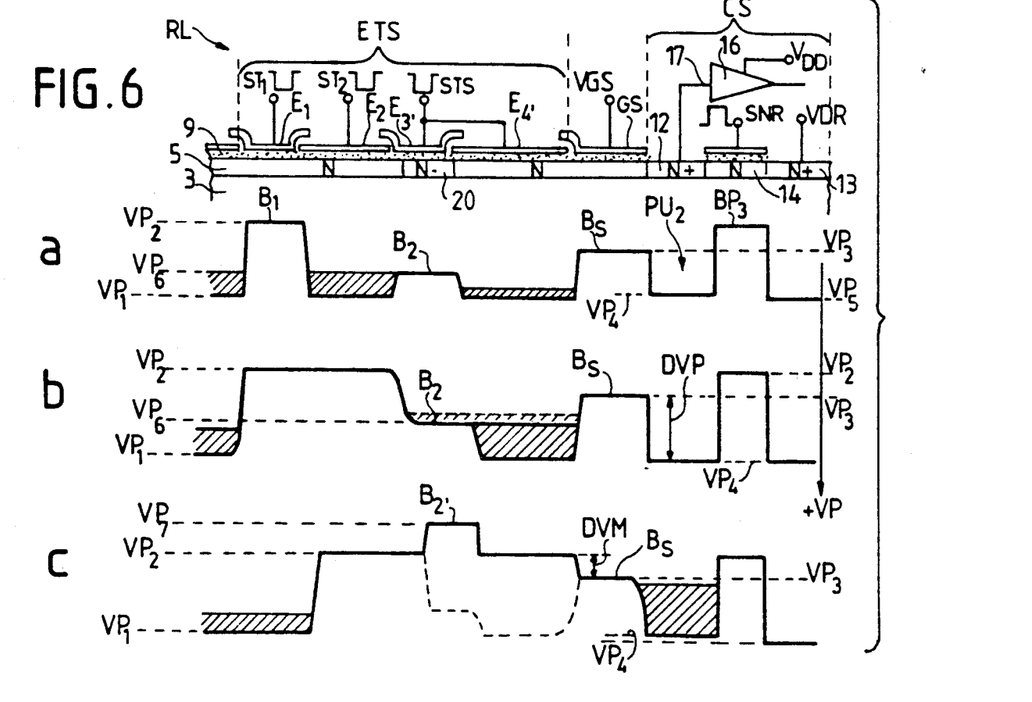

FIG. 6 is a schematic sectional view showing the reading register in a manner similar to that of FIG. 4, but one where the shift register RD is represented solely by the output transfer stage ETS to simplify the description.

FIGS. 6a, 6b and 6c should each be read at the same time as FIG. 6, and illustrate the shapes of the potentials that are set up notably beneath the different electrodes of the output transfer stage ETS and beneath the output gate GS.

Figure 5:
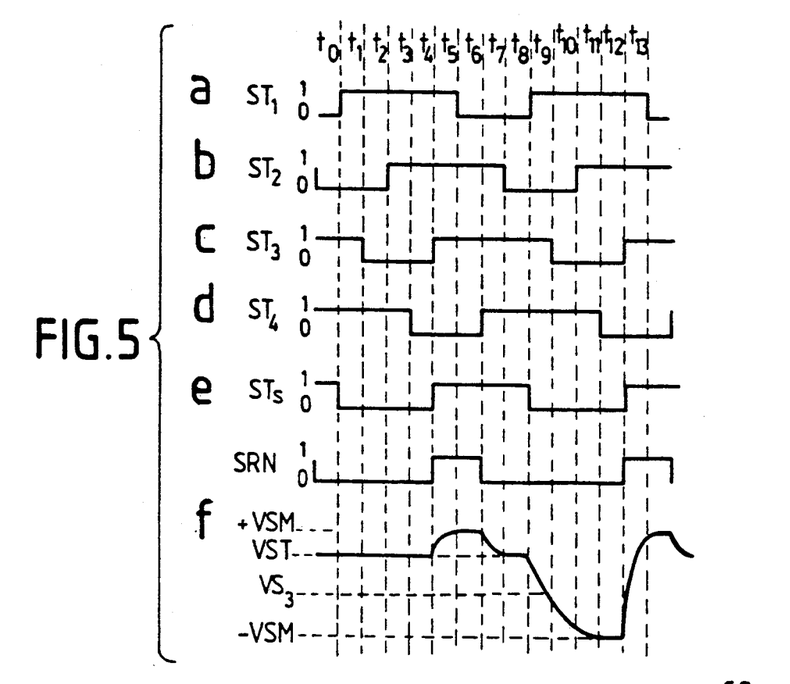
FIGS. 5a to 5g forms a timing diagram which shows the relationships of the phases between signals applied to the electrodes shown in FIG. 4 and an output signal delivered by an output amplifier shown in FIG. 4.

FIG. 6a shows the shapes of the potentials that exist in the substrate 3 between the instant t5 and the instant t7 of FIGS. 5.

Since the first transfer pulse ST1 has just changed from the state 1 to the state 0, the potential beneath the first electrode E1 is on the negative side, at the value VP2, for example, and forms a potential barrier B1. The second transfer pulse ST2 and the output transfer pulse STS are then at the state 1 and generate voltages on the positive side beneath the corresponding electrodes, that is, a voltage VP1 beneath the second electrode E2 and also a potential VP1 beneath the fourth or last electrode E4' of the pair of electrodes E3', E4' which are connected to each other. By contrast, in view of the slightly different doping made beneath the third or second last electrode E3' (as mentioned earlier), there is a potential threshold between the electrode E3' and the electrode E4' such that, beneath the electrode E3', there is created a potential VP6 that is negative with respect to the potential VP1 and positive with respect to the potential VP2 and enables the making, between the second electrode E2 and the last electrode E4', of a low level potential barrier B2. The voltage VGS applied to the output gate Gs determines, beneath this output gate, the potential BP3 which sets up the separation potential barrier BS beneath the output gate Gs. It must be noted that the second potential barrier B2 is lower than the separation potential barrier BS, that is, the potential VP6 beneath the third electrode E3'is more positive than the potential VP3 beneath the output gate GS. The resetting pulse SR is at the state 0 so that, beneath the control electrode EC of the output circuit CS, there is the negative potential VP2 which determines the potential barrier BP3 beneath this electrode. This potential barrier BP3 achieves a separation between the potential VP5 (which exists beneath the second N+doped zone 13) and the potential well PU2 (which exists between the first N+doped zone 12 and the bottom of which is at the potential VP4).

At the instant t5, the first transfer pulse has gone from the state 1 to the state 0, the effect of which is to shed, beneath the second electrode E2, the charges that were previously stored beneath the first electrode E1 (the charges are shown in hatched lines), and if the quantity of charges is great, some of these charges may spill over the second barrier B2 (beneath the second last electrode E3') and get collected beneath the last electrode E4'.

FIG. 6b illustrates the working and the shape of the potentials between the instant t7 and the instant t8. When, at the instant t7, the second transfer pulse ST2 goes from the state 1 to the state 0, the potential beneath the second electrode E2 goes from the value VP1 to the more negative value VP2, and all the charges which were stored beneath the second electrode E2 are transferred beneath the last and fourth electrodes E4'. None of these charges can spill over the separation barrier BS, the potential VP3 of which is sufficiently negative to this effect, the potential VP3 being more positive than the potential VP2 and more negative than the potential VP6 which forms the second potential barrier B2 due to the potential threshold presented by the third or second last electrode E3', in such a way that, ultimately, if the quantity of charges transferred beneath the second last electrode E4' were to be very great, it could spill over the second barrier B2.

It is noted that, as compared with the prior art, no charge has been transferred into the reading diode, namely into the second potential well PU2 formed beneath the first zone 12, and that the entire difference in potential DVP (formed by the difference between the potential VP3 of the barrier BS and the potential VP4 of the bottom of the well PU2) remains available to store charges on the reading diode 12a.

FIG. 6c illustrates the working and the shape of the potentials that exist between the instant t8 and the instant t12: at the instant t8, the output transfer pulse STS goes from the state 1 to the state 0, thus causing a negative variation of the potentials beneath the last and second last electrodes E4', E3', that is, beneath the mutually connected pairs of electrodes. The result thereof is that all the charges stored beneath the second last electrode E4' and, possibly, beneath the second last electrode E3' are transferred to the reading diode, namely to the second potential well PU2.

The passage of the output transfer pulse STS from the state 1 to the state 0 has modified the values of potentials beneath the last two electrodes E3', E4'while, at the same time, preserving the general shape (shown in dashes) that existed before the instant t8. For, firstly, beneath the last electrode E4', the potential has gone to the value VP2 which is more negative than the value VP3 of the separation barrier BS formed beneath the output gate GS. Secondly, the potential beneath the second last or third electrode E3' has gone to a value VP7 which is more negative than the value VP2, namely that the potential threshold (previously forming the barrier B2) which existed previously between the regions corresponding to the third or second last electrode E3' and the fourth or last electrode E4' is preserved (potential threshold obtained by means of the previously mentioned compensation). As a result, these potential thresholds now form a new potential barrier B2' which makes it possible to prohibit any return of charges backwards and thus enables high transfer efficiency.

It should also be noted that the potential VGS, applied to the output electrode GS, is just enough for the potential VP3, generated beneath the electrode GS, to be a little more positive than the potential VP2 in order to achieve a potential step DVM (DVM possibly being, for example, in the range of one to two volts) which enables the passage of the charges from the last electrode or fourth electrode E4' towards the floating reading diode 12a represented herein by the potential well PU2.

The output dynamic range is thus the maximum without its being necessary to increase the voltages VGS, VDR, $V_{DD}$.

This description constitutes a non-restrictive example that shows how to improve the reading precision and how to increase the reading output dynamic range of any reading register of the charge-coupled device type, working in modes other than the two-phase mode. Clearly, the invention can be applied to different structures, for example structures with or without buried channels, and also the technology used may be different, for example with two or more levels of polycrystalline silicon. It is also possible to modify the relative position of the signals applied to the shift registers and to the output circuits while, at the same time, remaining within the framework of the invention.

What is claimed is:

1. A reading register comprising a semiconductor substrate, a charge-coupled device type of shift register formed by a sequence of transfer stages, an output circuit placed in the vicinity of a last transfer stage according to the direction of transfer of the charges, each transfer stage having at least three mutually independent electrodes to which there are applied pulses of cyclical voltages forming transfer pulses having different phases for each electrode of one and the same transfer stage so as to generate in the substrate potential wells and potential barriers used to transfer the charges towards the output circuit, the output circuit having a terminal element for the storage of charges forming, in the substrate, a zone with floating potential connected to a reading amplifier, the terminal storage element being separated from the last transfer stage by an output gate beneath which there is formed a separation potential barrier, wherein, in the last transfer stage having at least three mutually independent electrodes two successive electrodes which are closest to the output gate are connected to each other and are controlled by one and the same output transfer pulse, these two mutually connected electrodes forming the second last and the last electrode of an output transfer stage in the charge transfer direction.

2. A reading register according to claim 1, comprising means for the generation, beneath said second last electrode, of a potential barrier with respect to the potential generated beneath the last electrode.

3. A reading register according to claim 2 wherein, beneath the second last electrode, there is formed a zone that is doped with a same type of conductivity as the zone beneath the last electrode but is less highly doped than the zone beneath this last electrode.

4. A reading register according to any of the preceding claims wherein the separation potential barrier, formed beneath the output gate, is a potential between a potential set up beneath the last electrode, when the charges are transferred to the terminal storage element, and a potential set up beneath the second last electrode, when the charges are liable to be stored beneath the last electrode.

* * * * *